United States Patent
Dieringer

(10) Patent No.: US 10,135,411 B2
(45) Date of Patent: Nov. 20, 2018

(54) PATROL VEHICLE COMMUNICATIONS SYSTEM FOR USERS OF BOTH MOBILE AND PORTABLE RADIOS

(71) Applicant: Michael D. Dieringer, Rolling Hills, CA (US)

(72) Inventor: Michael D. Dieringer, Rolling Hills, CA (US)

( * ) Notice: Subject to any disclaimer, the term of this patent is extended or adjusted under 35 U.S.C. 154(b) by 0 days.

(21) Appl. No.: 15/731,251

(22) Filed: May 10, 2017

(65) Prior Publication Data

US 2018/0013393 A1    Jan. 11, 2018

Related U.S. Application Data

(60) Provisional application No. 62/392,069, filed on May 19, 2016.

(51) Int. Cl.

| | |
|---|---|
| *H04B 1/38* | (2015.01) |
| *H03G 3/20* | (2006.01) |
| *H04B 1/3827* | (2015.01) |
| *B60N 2/00* | (2006.01) |
| *H04B 1/3822* | (2015.01) |
| *H03G 3/30* | (2006.01) |
| *H03G 3/32* | (2006.01) |

(52) U.S. Cl.
CPC ............... *H03G 3/20* (2013.01); *B60N 2/002* (2013.01); *H03G 3/3005* (2013.01); *H04B 1/385* (2013.01); *H04B 1/3822* (2013.01); *H03G 3/32* (2013.01); *H04R 2430/01* (2013.01); *H04R 2499/13* (2013.01)

(58) Field of Classification Search
CPC ................................. B60N 2/002; H03G 3/20
USPC ........................................................ 455/90.2
See application file for complete search history.

(56) References Cited

U.S. PATENT DOCUMENTS

| | | | |
|---|---|---|---|
| 6,015,160 | A | 1/2000 | Spector |
| 6,225,584 | B1 | 5/2001 | Ase et al. |
| 6,311,052 | B1 | 10/2001 | Lenz |
| 7,062,301 | B1 | 6/2006 | Dieringer |
| 7,203,525 | B2 | 4/2007 | Dieringer |
| 9,042,944 | B2 | 3/2015 | Dieringer |
| 2003/0026440 | A1 | 2/2003 | Lazzeroni et al. |
| 2004/0235429 | A1 | 11/2004 | Garavaglia et al. |
| 2007/0004464 | A1* | 1/2007 | Lair ............... H04M 1/6066 455/569.1 |

(Continued)

*Primary Examiner* — Ajibola Akinyemi
(74) *Attorney, Agent, or Firm* — Michael E. McKee

(57) ABSTRACT

In a communications system for an individual who has access to a vehicle-mounted two-way radio and a portable two-way radio which includes a speakermic having a speaker through which audible messages are transmitted for the individual to hear, there is provided a volume control arrangement associated with the speakermic through which the audio volume of the speakermic speaker can be adjusted. The system also includes a transmitter for transmitting a signal to the volume control arrangement that the individual is seated in the vehicle, and further includes a transmitter for transmitting a signal to the volume control arrangement that the mobile radio is energized. A receiver is associated with the volume control arrangement of the speakermic so that upon receipt of the signals transmitted from the two transmitters, the audio volume of the speaker of the speakermic is automatically lowered.

10 Claims, 2 Drawing Sheets

(56) References Cited

U.S. PATENT DOCUMENTS

2008/0143085 A1* 6/2008 Breed ............... B60R 21/01516
                                                    280/735
2015/0080061 A1* 3/2015 Dieringer ............ H04M 1/6066
                                                    455/569.1

* cited by examiner

PATROL VEHICLE COMMUNICATIONS SYSTEM FOR USERS OF BOTH MOBILE AND PORTABLE RADIOS

The benefit of Provisional Application Ser. No. 62/392,069, filed May 19, 2016 and entitled PATROL VEHICLE COMMUNICATIONS SYSTEM FOR USERS OF BOTH MOBILE AND PORTABLE RADIOS, is hereby claimed. The disclosure of this referenced provisional application is incorporated herein by reference.

BACKGROUND OF THE INVENTION

This invention relates generally to communication systems for use by individuals who have access to both a mobile radio mounted within a vehicle and a portable radio carried upon the person of the individual and relates, more particularly, to means and methods for controlling various operating capabilities and characteristics of such a system.

It is not uncommon that an individual, such as a law enforcement officer, carry on his person a portable two-way radio and also have access to a vehicle in which a mobile two-way radio is mounted, or installed. When such an individual is away from his vehicle, he will, out of necessity, utilize his portable two-way radio to communicate to a remote site, but upon return to his vehicle, he will normally utilize the vehicle-mounted mobile radio for communication purposes, rather than the portable radio, due to the greater power typically possessed by the mobile radio.

In the situation in which the individual returns to his vehicle and he desires to utilize his mobile radio, he must manually lower the audio volume of his portable radio (which typically involves the adjustment of a volume control dial associated with a speakermic mounted in the lapel area of his clothing) so that feedback does not occur during subsequent transmissions of his voice messages over the mobile radio. Otherwise, the portable radio is likely to pick up and play his voice messages spoken into the microphone of the mobile radio by way of the speakermic of the portable radio and which are subsequently included within the transmission of the signals of the mobile radio—causing feedback.

It would be desirable to provide a communications system of the aforedescribed class which does not require that the individual manually reduce the volume of the portable two-way radio in the event that the individual returns to his vehicle and wishes to revert to the use of his vehicle-mounted mobile radio for communication purposes.

Accordingly, it is an object of the present invention to provide a new and improved communications system for use by an individual whose has access to both a vehicle-mounted mobile two-way radio and a portable two-way radio wherein the components of the system perform a task for the individual automatically, which task was heretofore performed manually.

Another object of the present invention is to provide such a communications system whose components are capable of automatically adjusting the audio volume of the portable radio upon the occurrence of at least one predetermined event.

Still another object of the present invention is to provide such a communications system whose components are capable of automatically adjusting the audio volume of the portable radio when an individual is seated within a seat of the vehicle and when the power to the vehicle-mounted mobile radio is switched ON.

Yet another object of the present invention is to provides such a communications system which is uncomplicated in structure, yet effective in operation.

SUMMARY OF THE INVENTION

This invention resides in an improvement in a communications system for an individual who has access to a vehicle, a vehicle-mounted two-way radio and a portable two-way radio which includes a speakermic having a speaker through which audible messages are transmitted through the portable radio for the individual to hear, and wherein the vehicle includes a seat.

The improvement is characterized in that the speakermic has a volume control arrangement through which the volume level of the speaker of the speakermic can be adjusted from a preset level of volume and there is associated with the volume control arrangement a receiver which is adapted to lower the volume level of the speaker of the speakermic upon receipt of signals indicative that predetermined conditions have been met. Furthermore, the communications system includes (a) presence-sensing means for sensing the presence of the individual when the individual is seated in the seat of the vehicle and means associated with the presence-sensing means for transmitting a signal to the receiver associated with the volume control arrangement of the speakermic speaker that the individual is seated in the vehicle and (b) power-sensing means for sensing that the mobile radio is energized and means associated with the mobile radio power-sensing means for transmitting a signal to the receiver associated with the volume control arrangement of the speakermic speaker that the mobile radio is energized. Upon receipt, by the receiver, of a signal from the presence-sensing means indicative that the individual is seated in the vehicle seat and of a signal from the power-sensing means indicative that the mobile radio is energized, the audio volume of the speaker of the speakermic is automatically lowered from the preset level by way of the volume control arrangement.

DETAILED DESCRIPTION OF AN ILLUSTRATIVE EMBODIMENT

Figure 1:
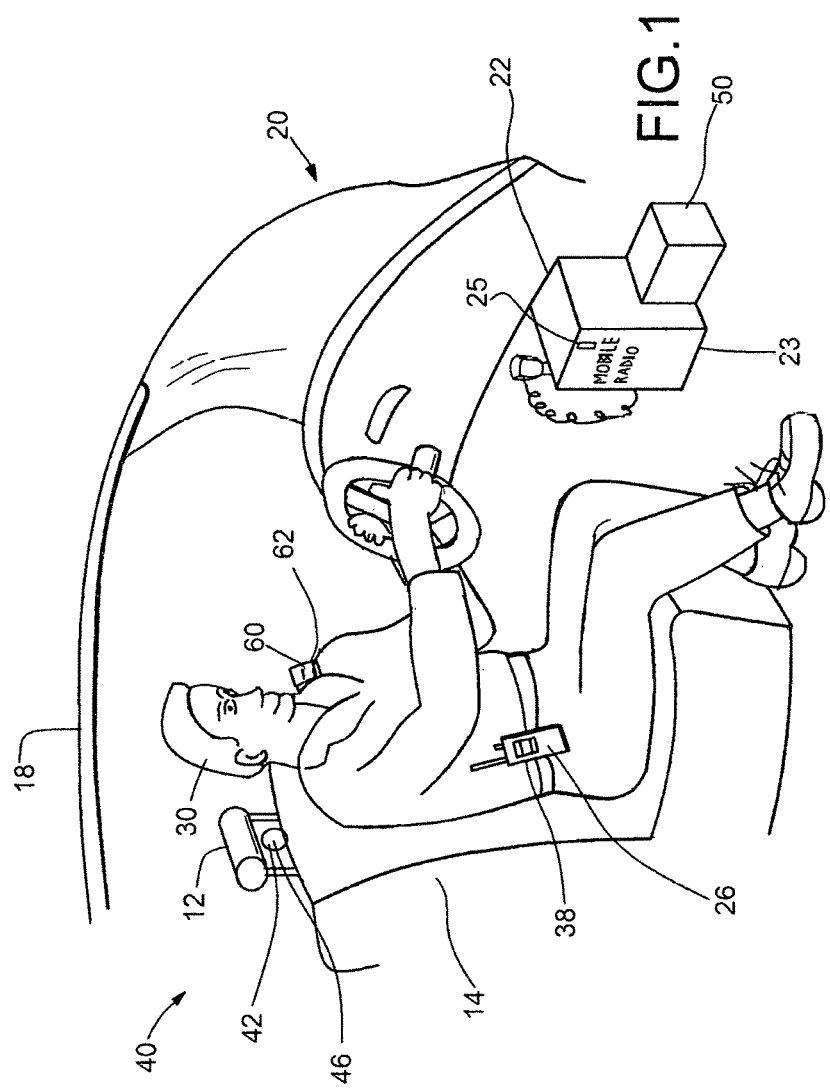
FIG. 1 is a perspective view of a communications system embodying features of the present invention and shown utilized in an exemplary environment of intended use.

Turning now to the drawings in greater detail and considering first FIG. 1, there is schematically illustrated an embodiment, generally indicated 20, of a communications system within which features of the present invention are embodied and shown utilized in an exemplary environment of intended use. The communications system 20 includes a vehicle-mounted mobile two-way radio system 22 whose components are mounted entirely within the body of a vehicle 18, and a portable two-way radio system 26 whose components are worn upon the person of an individual 30, such as a law enforcement officer, who is seated in the driver's seat, indicated 14, of the vehicle 18.

As will be apparent herein, the communications system 20 includes componentry for sensing the presence of the individual 30 when the individual 30 is seated within the seat 14 of the vehicle 18 and componentry for sensing when the mobile radio 22 is energized (i.e. switched ON). This componentry, described herein, will automatically adjust (e.g. turn down) the volume of the portable radio system 26 when both the individual 30 is seated within the seat 14 and the mobile radio 22 is energized.

Figure 2:
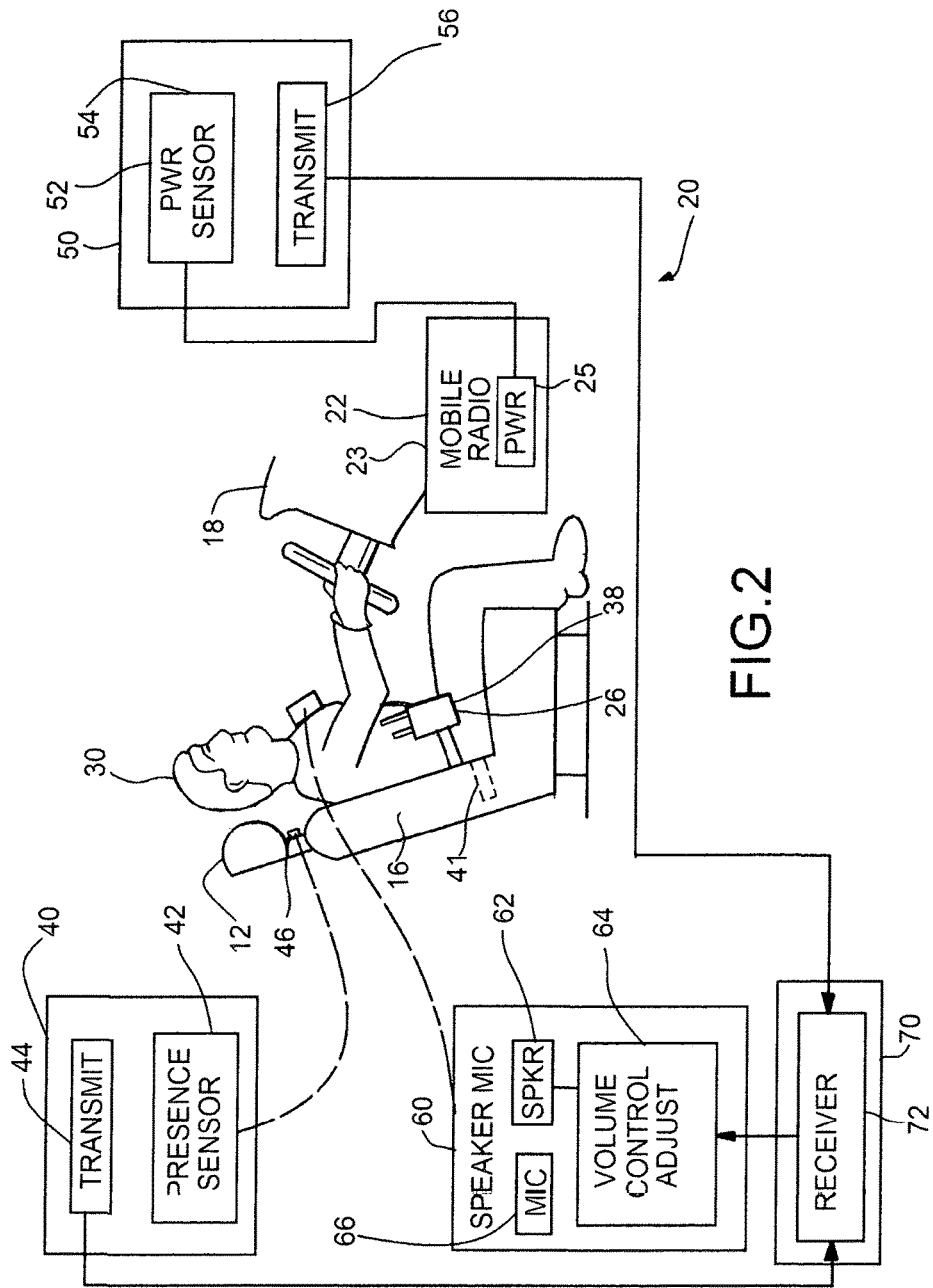
FIG. 2 is a view illustrating in block diagram form the operation of the communications system of FIG. 1.

The operation of the communications system 20 can be best understood with reference to the block diagram of FIG. 2. In particular, the communications system 20 includes a presence-sensing system 40 having a presence sensor 42 which is adapted to sense the presence of the individual 30 when seated within the seat 14 of the vehicle 18 and having an associated transmitter 44 for wirelessly transmitting a signal which corresponds to, or is indicative, of the fact (or event) that the individual 30 is seated within the seat 14. In other words, as long as the individual 30 is seated in the seat 14, a signal is generated by the sensor 42 that the individual 30 is, in fact, seated within the seat; and unless or until the individual 30 is present within the seat 14, no signal is generated by the sensor 42. The sensor 42 can take any of a number of forms, such as a plunger-operated switch 41 (FIG. 2) whose plunger is depressed (against the biasing force of a spring) when the individual 30 sits upon the seat 14, or the sensor 42 can take the form of a proximity sensor 46 (FIGS. 1 and 2) mounted within the headrest 12 (FIG. 1) of the seat 14 so that as soon as the individual 30 assumes a normal seating position within the seat 14, the sensor 42 senses the presence of the individual's head in front of the headrest 12 of the vehicle seat 14 and generates the corresponding (i.e. switching) signal for transmission (e.g. wirelessly) from the transmitter 44.

The communications system 20 also includes a power sensing system 50 which is mounted adjacent the body, indicated 23, of the mobile radio 22 and which includes a power sensor 52 which is adapted to sense the energized (i.e. the switched ON) condition of the mobile radio 22 and an associated transmitter 56 for wirelessly transmitting a signal which corresponds to, or is indicative, of the fact (or event) that the mobile radio 22 is switched ON. In other words, as long as the power switch, indicated 25, of the mobile radio 22 is switched ON, a signal is generated by the sensor 52 (for transmission by the transmitter 56) that the mobile radio 22 is, in fact, switched ON; and unless or until the mobile radio 22 has been switched ON, no signal is generated by the power sensor 52. Although the power sensor 52 can take any of a number of forms, the sensor 52 of the depicted embodiment 20 is in the form of an two-position switch 54 which is wired to the power switch 25 of the mobile radio 22 for switching to a "signalling mode" during which a signal is generated indicative of the energized condition of the mobile radio 22 for transmission by the transmitter 56 to a site described herein.

Meanwhile, there is associated with the portable radio 26 a speakermic 60 which is adapted to be worn on the lapel area of the clothing of the individual 30, and the speakermic 60 includes a microphone 66 and a speaker 62 through which messages which are transmitted to the portable radio 26 for the individual 30 to hear. Also associated with the portable radio 26 is a volume controller 64 through which the audio volume of the portable radio 26 is capable of being adjusted between raised and lowered volume levels.

With reference again to FIGS. 1 and 2, the portable radio 26 includes a body 38 which is attached near the waist, or along the belt, of the individual 30. The major components and operating characteristics of the portable radio 26 are well-known so that a detailed description thereof is not believed to be necessary. Suffice it to say that the portable radio 26 is capable of being switched between a "talk" mode and a "non-talk" mode as an appropriate push-to-talk (PTT) switch is actuated.

It is a feature of the communications system 20 that it includes a signal receiving system 70 which is mounted adjacent the speakermic 60 of the portable radio 26 and which includes a receiver 72 for receiving the signals which are (wirelessly) transmitted from both the presence-sensing sensor 42 and the power sensor 52. Operationally, the receiver 72 is adapted to receive the signals from the sensors 42 and 52 and generate a signal indicative that signals from both sensors 42 and 52 have been received. The receiver 72, in turn, is connected to the volume controller 64 of the speakermic 60 so that upon receipt of signals from both of the transmitters 44 and 56, the volume level of the speakermic 60 is lowered.

It follows that the receiver 72 only sends an appropriate (volume-lowering) command signal to the volume controller 64 if signals from both of the presence-sensing sensor 42 and the power sensor 52 are received by the receiver 72. Thus, no (volume-lowering) command signal is sent from the receiver 72 to the volume controller 64 unless both the individual 30 is seated in the seat 14 and the power to the mobile radio 22 is switched ON (indicating that the both of the aforedescribed events are "true").

Upon cessation of the sending of any volume-lowering command signal from the receiver 72 to the volume controller (which would be indicative that either the individual 30 has moved out of his seat 14 or the power to the mobile radio 26 has been switched OFF, the volume level of the portable radio 26 reverts to its previous, or pre-set (e.g. original), level.

It will be understood that numerous modifications and substitutions can be had to the aforedescribed embodiment 20 without departing from the spirit of the invention. Accordingly, the aforedescribed embodiment 20 is intended for the purpose of illustration and not as limitation.

The invention claimed is:

1. In a communications system for an individual who has access to a vehicle, a vehicle-mounted two-way radio and a portable two-way radio which includes a speakermic having a speaker through which audible messages are transmitted through the portable radio for the individual to hear, and wherein the vehicle includes a seat, the improvement characterized in that:

the speakermic has a volume control arrangement through which the audio volume level of the speaker of the speakermic can be adjusted from a preset level of volume and there is associated with the volume control arrangement a receiver which is adapted to lower the audio volume level of the speaker of the speakermic upon receipt of wireless communication indicating that two predetermined conditions have been met and wherein the operating power of the receiver is not supplied through the vehicle-mounted two-way radio; and the communications system includes
(a) presence-sensing means for sensing the presence of the individual when the individual is seated in the seat of the vehicle,
(b) power-sensing means for sensing that the mobile radio is energized, and
(c) means associated with the presence-sensing means and the power-sensing means for wirelessly communicating with the receiver of the speakermic that the individual is seated within the seat of the vehicle and that the mobile radio is energized so that upon receipt, by the receiver, of wireless communication indicating that the individual is seated in the vehicle seat and that the mobile radio is energized, the volume of the speaker of the speakermic is automatically lowered from a preset level by way of the volume control arrangement so that as long as wireless communication is being received by the receiver indicating that the individual is seated within the seat and the mobile radio is energized, the volume of the speaker of the speakermic remains lowered from the preset level by way of the volume control arrangement.

2. The improvement as defined in claim 1 wherein the associated means includes means associated with the presence-sensing means for transmitting a signal to the receiver that the individual is seated within the vehicle and means associated with the power-sensing means for transmitting a signal to the receiver that the mobile radio is energized, and each of the means for transmitting of the presence-sensing means and the means for transmitting of the power-sensing means is adapted to transmit a corresponding signal wirelessly to the receiver associated with the volume control arrangement, and the receiver associated with the volume control arrangement of the speakermic is adapted to receive a wirelessly-transmitted signal from the presence-sensing means and a wirelessly-transmitted signal from the power-sensing means.

3. The improvement as defined in claim 2 wherein the volume control arrangement of the speakermic is adapted to return the volume of the speakermic speaker to the preset level when the signal being transmitted from either the presence-sensing means or the power sensing means ceases.

4. The improvement as defined in claim 1 wherein the presence-sensing means includes a proximity sensor mounted adjacent the seat of the vehicle for sensing the presence of the individual when seated in the seat.

5. The improvement as defined in claim 1 wherein the presence-sensing means includes a plunger-operable switch mounted adjacent the seat of the vehicle and capable of being actuated when the individual sits upon the seat.

6. In a communications system for an individual who has access to a vehicle, a vehicle-mounted two-way radio and a portable two-way radio which includes a speakermic carried by the individual and which includes a speaker through which audible messages are transmitted through the portable radio for the individual to hear, and wherein the vehicle includes a driver's seat, the improvement characterized in that:

the communications system includes (a) presence-sensing means for sensing the presence of the individual when the individual is seated in the driver's seat of the vehicle, (b) power-sensing means for sensing that the mobile radio is energized, and (c) means associated with the presence-sensing means and the power-sensing means for generating wireless communication that the individual is seated within the driver's seat of the vehicle and that the mobile radio is energized; and the speakermic has a volume control arrangement through which the audio volume level of the speaker of the speakermic can be adjusted from a preset level of volume and there is associated with the volume control arrangement a receiver which is adapted to lower the audio volume level of the speaker of the speakermic upon receipt of the wireless communication generated by the associated means that the individual is seated in the driver's seat and that the mobile radio is energized and wherein the operating power of the receiver is not supplied through the vehicle-mounted two-way radio so that upon receipt, by the receiver of the speakermic, of the wireless communication generated by the associated means indicating that the individual is seated in the driver's seat of the vehicle and that the mobile radio is energized, the volume of the speaker of the speakermic is automatically lowered from a preset level by way of the volume control arrangement; and wherein the wireless communication received by the receiver from the associated means is indicative that two predetermined conditions have been met; and so that as long as the individual is seated in the driver's seat and the mobile radio is energized, the volume of the speaker of the speakermic remains lowered from the preset level by way of the volume control arrangement.

7. The improvement as defined in claim 6 wherein the associated means includes means associated with the presence-sensing means for transmitting a signal to the receiver that the individual is seated within the vehicle and means associated with the power-sensing means for transmitting a signal to the receiver that the mobile radio is energized, and each of the means for transmitting of the presence-sensing means and the means for transmitting of the power-sensing means is adapted to transmit a corresponding signal wirelessly to the receiver associated with the volume control arrangement.

8. The improvement as defined in claim 6 wherein the volume control arrangement of the speakermic is adapted to return the volume of the speakermic speaker to the preset level when the signal being transmitted from either the presence-sensing means or the power sensing means ceases.

9. The improvement as defined in claim 6 wherein the presence-sensing means includes a proximity sensor mounted adjacent the seat of the vehicle for sensing the presence of the individual when seated in the seat.

10. The improvement as defined in claim 6 wherein the presence-sensing means includes a plunger-operable switch mounted adjacent the seat of the vehicle and capable of being actuated when the individual sits upon the seat.

* * * * *